United States Patent [19]

Kaneko et al.

[11] 4,233,574

[45] Nov. 11, 1980

[54] OSCILLATION CIRCUIT

[75] Inventors: Kenji Kaneko, Hachioji; Takahiro Okabe, Hinodemachi, both of Japan

[73] Assignee: Hitachi, Ltd., Japan

[21] Appl. No.: 922,370

[22] Filed: Jul. 6, 1978

[30] Foreign Application Priority Data

Jul. 15, 1977 [JP] Japan .................................. 52-84278
Mar. 24, 1978 [JP] Japan .................................. 53-33051
May 19, 1978 [JP] Japan ............................. 53-66547[U]

[51] Int. Cl.³ ...................... H03B 5/36; H03K 3/282
[52] U.S. Cl. ................................ 331/108 D; 331/111; 331/116 R
[58] Field of Search ................. 331/116 R, 111, 113, 331/108 D, 108 C; 330/290–294, 307; 307/213, 303; 357/92

[56] References Cited

U.S. PATENT DOCUMENTS

| | | | |
|---|---|---|---|
| 1,993,783 | 3/1935 | Heegner | 331/159 |
| 3,579,139 | 5/1971 | Rhee | 331/113 R |
| 3,585,526 | 6/1971 | Zelinka | 331/113 R |
| 3,626,329 | 12/1971 | Larson | 331/116 R |
| 3,942,134 | 3/1976 | Schade, Jr. | 331/113 R |
| 4,025,877 | 5/1977 | Hara et al. | 331/113 R |
| 4,080,577 | 3/1978 | Asada et al. | 330/290 X |

*Primary Examiner*—Siegfried H. Grimm
*Attorney, Agent, or Firm*—Craig & Antonelli

[57] ABSTRACT

An oscillation circuit including an amplifier portion wherein the collector of a first switching transistor has a load connected thereto, means is provided for transmitting an output of the collector of the first switching transistor to the base thereof, means is provided for transmitting the output of the collector of the first switching transistor to the base of a second switching transistor, and the collector of the second switching transistor has a load connected thereto. A capacitive element is connected between the collector of the second switching transistor and the base of the first switching transistor of the amplifier portion so as to feedback an output of the second switching transistor to the first switching transistor to operate the circuit as an oscillator.

14 Claims, 26 Drawing Figures

OSCILLATION CIRCUIT

BACKGROUND OF THE INVENTION (1) Field of the Invention

This invention relates to an oscillation circuit which comprises a few switching transistors and loads in its amplifier portion and a capacitive element. More particularly, it provides an oscillation circuit in which switching elements and loads in the amplifier portion are constructed in the form of integrated injection logic ($I^2L$) circuits, whereby the oscillation circuit requires only a very small area in a semiconductor integrated circuit (IC), exhibits a high performance and is capable of a low voltage operation (at approximately 0.6 V) as well as a low power operation.

(2) Description of the Prior Art

Various systems often require timing clocks, clocks for the analog-to-digital conversion, clocks for timekeeping devices, etc. In order to generate such clocks, an oscillation circuit is needed.

Especially in a case where a system is constructed by the use of an integrated circuit, it is desirable that the oscillation circuit can be formed on an identical chip together with the other circuits. In that case, it is desired that the oscillation circuit can be realized in the smallest possible area.

Also in a case where a system is constructed by the use of an integrated injection logic circuit, the oscillation circuit is often necessary. Heretofore, in the case of assembling the oscillation circuit into the system employing the $I^2L$ circuit, the oscillation circuit has often been formed of ordinary transistors and resistors by exploiting the fact that the $I^2L$ circuit and the other circuits such as linear circuits can coexist on an identical chip. In this case, although the oscillation circuit can coexist on the identical chip, its occupying area becomes very large on account of the use of the usual transistors, resistors etc. Another difficulty is that the oscillation output needs to be converted up to the operating voltage level of the $I^2L$ circuit.

As a circuit improved in the above points, there has been proposed an oscillation circuit as shown in FIG. 1 wherein an integrated injection logic circuit and ordinary transistors mix ("Denshi Tsushin Gakkai, Gijutsu Kenkyu Hokoku"—Technical Research Report of the Electronics and Communication Society—, Vol. 75, No. 209, SSD75-67 to 72, pp. 41–50, published Jan. 27, 1976). The circuit of FIG. 1 has such merits that no resistors are required, that the number of constituent elemens of the oscillation circuit is small, and that the conversion of the output voltage level for the $I^2L$ circuit is unnecessary. Since, however, the ordinary elements such as npn and pnp transistors and diodes are employed, the areas of these elements are large, and the oscillation circuit still occupies a large area.

SUMMARY OF THE INVENTION

An object of this invention is to provide an oscillation circuit of very small area (several tenths of the area of the prior-art oscillation circuit), of high performance, and capable of a low voltage operation (at about 0.6 V) as well as a low power dissipation operation by the use of only integrated injection logic circuits in the amplifier portion and a capacitive element, or integrated injection logic circuits as well as a common base type pnp lateral transistor and a capacitive element.

The fundamental construction of this invention consists in a circuit illustrated in FIG. 2. That is, the oscillation circuit having an amplifier portion of this invention is an oscillation circuit wherein the collector of a first switching transistor has a load connected thereto, means is provided for transmitting an output of the collector of the first switching transistor to the base thereof, means is provided for transmitting the output of the collector of the first switching transistor to the base of a second switching transistor, and the collector of the second switching transistor has a load connected thereto. A capacitive element is connected between the collector of the second switching transistor and the base of the first switching transistor so as to feedback an output of the second switching transistor to the first switching transistor so that the circuit oscillates.

The oscillation circuit of such a construction has the following features:
 (i) An oscillation circuit including a buffer can be constructed of three $I^2L$ circuits, and its area is very small.
 (ii) The oscillation circuit is operable at an operating current of approximately 0.5 $\mu A$.
 (iii) The oscillation circuit is operable whether a capacitor or a crystal resonator is mounted as a capacitive element 4.

BRIEF DESCRIPTION OF THE DRAWINGS

FIG. 9 is a circuit diagram showing a second embodiment of the construction wherein the oscillation output of the oscillation circuit of FIG. 2 is derived from one of the multi-collector portions of a transistor 2a.

DESCRIPTION OF THE PREFERRED EMBODIMENTS

Embodiment 1

Figure 2:
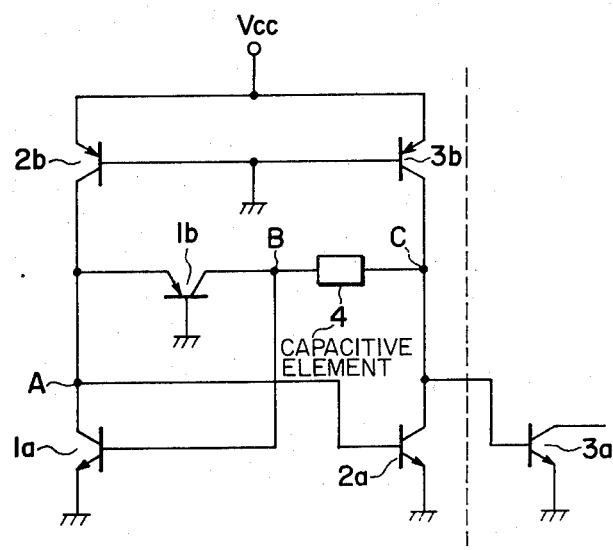
FIG. 2 is a circuit diagram showing a first embodiment of the oscillation circuit according to this invention.

FIG. 2 shows an oscillation circuit of a first embodiment according to this invention. In the first embodiment, the oscillation circuit of this invention is constructed as described hereunder.

Referring to FIG. 2, symbols $1a$, $2a$ and $3a$ designate inverse npn transistors, and symbols $1b$, $2b$ and $3b$ denote common base type pnp lateral transistors. The sets of the transistors ($1a$, $1b$), ($2a$, $2b$) and ($3a$, $3b$) form three integrated injection logic circuits ($I^2L$ circuits). Numeral 4 indicates a capacitive element. As the capacitive element, a capacitor, a crystal resonator or the like can be usually employed. As the capacitor, besides the common capacitor to be externally mounted, a junction capacitance or a MOS capacitance within an integrated circuit can be used.

The emitter of the pnp transistor $1b$ of the $I^2L$ circuit (hereinbelow, the emitter shall be termed "injector" as it is generally called in the $I^2L$ circuit) and the base of the npn transistor $2a$ of the $I^2L$ circuit are connected to the collector of the npn transistor $1a$ of the $I^2L$ circuit. The collector of the npn transistor $2a$ of the $I^2L$ circuit is connected to the base of the npn transistor $3a$ of the $I^2L$ circuit. The capacitive element 4 is connected between the base of the npn transistor $1a$ of the $I^2L$ circuit and the collector of the transistor $2a$. Power is supplied to the injectors of the lateral pnp transistors $2b$ and $3b$ of the $I^2L$ circuits. The npn transistor $3a$ of the $I^2L$ circuit is used in order to derive the output of the oscillator.

Figure 3C:
FIGS. 3A, 3B and 3C are oscillation waveform diagrams for elucidating the operation of the oscillation circuit in FIG. 2.
Figure 3B:
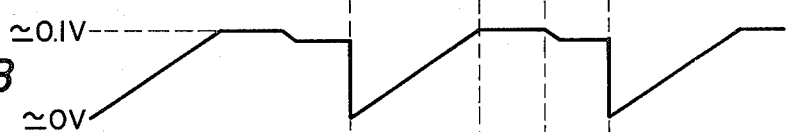
Figure 3A:
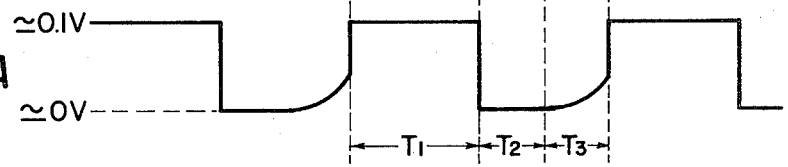

Referring now to FIGS. 3A, 3B and 3C, the operation of the oscillation circuit according to this invention shown in FIG. 2 will be explained as to a case where a capacitor is employed as the capacitive element. FIGS. 3A, 3B and 3C show oscillation waveforms at points A, B and C in FIG. 2, respectively.

Consider first the time when the npn transistor $1a$ of the $I^2L$ circuit is in the "off" state in FIG. 2. (This corresponds to a period of time $T_1$ in FIGS. 3A, 3B and 3C.) At this time, the npn transistor $2a$ of the $I^2L$ circuit is in the "on" state. The moment this npn transistor has turned "on," the potential of the point C in FIG. 2 is lowered, and the potential of the point B is simultaneously lowered, so that the npn transistor $1a$ of the $I^2L$ circuit becomes the "off" state. Under this state, a charging current flows from the pnp transistor $2b$ of the $I^2L$ circuit through the pnp transistor $1b$ to the capacitor 4, and the potential of the point B rises gradually. Since the pnp transistors $2b$ and $1b$ of the $I^2L$ circuits operate substantially as constant-current circuits, the rise of the potential of the point B in FIG. 2 is a linear increase versus time. When the potential of the point B has become a value enough to bring the npn transistor $1a$ of the $I^2L$ circuit into the "on" state, this npn transistor $1a$ absorbs the current from the pnp transistor $2b$ of the $I^2L$ circuit and lowers the potential of the point A. The moment the potential of the point A has lowered, the npn transistor $2a$ of the $I^2L$ circuit becomes the "off" state, and a current from the pnp transistor $3b$ of the $I^2L$ circuit flows to the capacitor 4 as a charging current. Simultaneously, this charging current flows into the base of the npn transistor $1a$ of the $I^2L$ circuit and exerts the regenerative action of shifting the npn transistor to the "on" state deeper and deeper.

When the npn transistor $2a$ of the $I^2L$ circuit has become the "off" state, the current from the pnp transistor $3b$ of the $I^2L$ circuit flows into the capacitor 4 as the charging current and raises the potential of the point C. (This corresponds to the waveform in a period of time $T_2$ in FIG. 3C.) The rise of the potential of the point C at this time is a linear rise versus time for the same reason as in the rise of the potential of the point B previously described.

When the potential of the point C has risen and the npn transistor $3a$ of the $I^2L$ circuit has become the "on" state, the base current of the npn transistor $3a$ increases abruptly, so that the charging current to the capacitor 4 decreases abruptly. For this reason, the base current of the npn transistor $1a$ of the $I^2L$ circuit decreases gradually according to a time constant determined by the capacitance 4 and the base current, the potential of the point B decreases gradually, and the npn transistor $1a$ becomes the "off" state. (This corresponds to the waveform in a period of time $T_3$ in FIG. 3B.) At this time, the npn transistor $2a$ of the $I^2L$ circuit becomes the "on" state and suddenly lowers the potential of the point C to zero V.

By repeating the above operation, the oscillation circuit in FIG. 2 according to this invention operates. The oscillation circuit according to this invention has the active elements made up of only the $I^2L$ circuits as illustrated in FIG. 2, so that it is operable at a low supply voltage of about 0.6 V. Moreover, in case where the oscillation circuit of this invention is built in a system constructed of $I^2L$ circuits, it is especially effective because the levels of oscillation outputs and the fabricating techniques are quite the same.

Figure 4A:
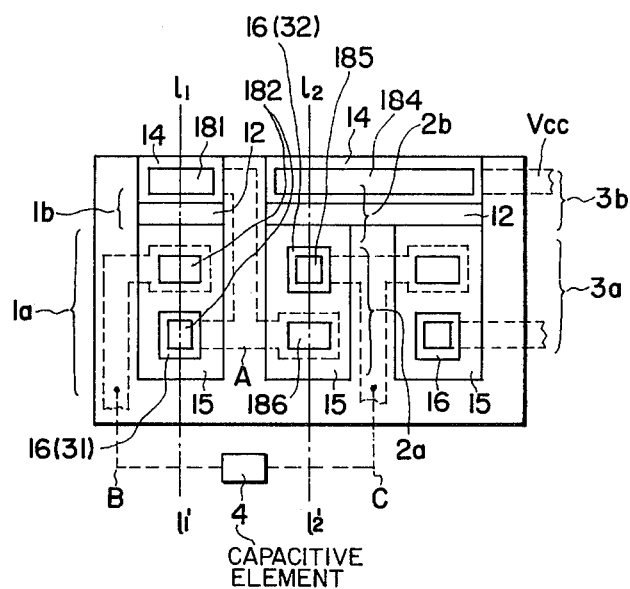
FIG. 4A is a plan pattern view at the time when the oscillation circuit of FIG. 2 is constructed of an integrated circuit.
Figure 4B:
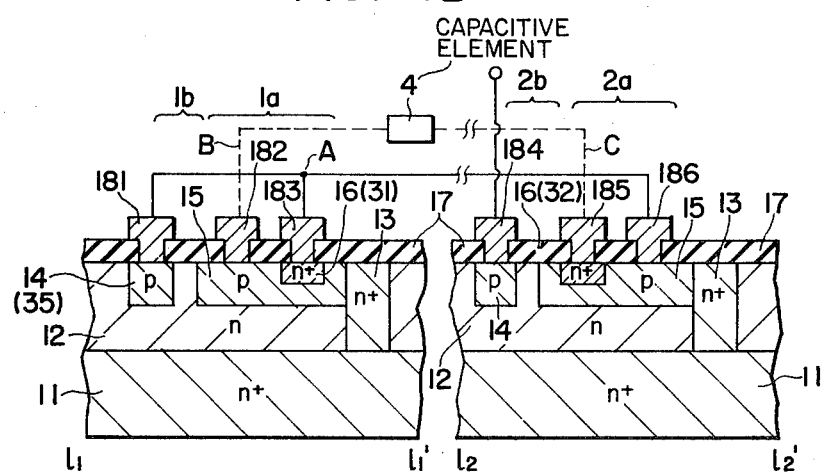
FIG. 4B is a sectional view of the elements of the integrated circuit as taken along line $l_1-l_1'$ and line $l_2-l_2'$ in FIG. 4A.

FIGS. 4A and 4B are a plan pattern view and a structural sectional view, respectively, in the case where the oscillation circuit according to this invention shown in FIG. 2 is performed in the form of an integrated semiconductor circuit.

Figure 1:
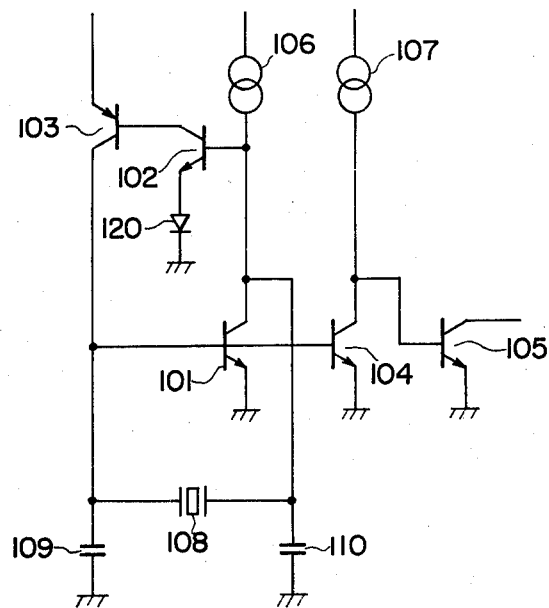
FIG. 1 is a circuit diagram showing a prior-art oscillation circuit in which an integrated injection logic and conventional bipolar transistors mix.

In FIG. 4A, all the I²L circuits 1a and 1b, 2a and 2b, and 3a and 3b shown in FIG. 2 can be formed within an identical isolated layer, so that the area becomes very small. The oscillation circuit according to this invention can be realized in an area of about ⅓ of the area of the prior-art circuit shown in FIG. 1 when both the circuits are constructed under the same layout rules.

FIG. 4B shows sections taken along lines $l_1-l_1'$ and $l_2-l_2'$ in FIG. 4A. The structure of the I²L circuits illustrated in FIG. 4B can be formed by hitherto known techniques. Referring to FIG. 4B, numeral 11 designates an n-type semiconductor (Si) body of high impurity concentration, and numeral 12 an n-type semiconductor (Si) layer of low impurity concentration. Shown at 13 is an n-type semiconductor region of high impurity concentration. This region 13 may be either a deep region as shown in FIG. 4B, or a shallow region which is formed simultaneously with an n-type semiconductor region 16. Numerals 14 and 15 denote p-type semiconductor regions, numeral 17 an insulator, and numerals 181-186 electrodes.

In FIG. 4B, the n-type semiconductor layers 11 and 12 and the n-type semiconductor region 13 serve as the emitter of the npn transistor and the base of the pnp transistor of the I²L circuit. The p-type semiconductor region 15 serves as the base of the npn transistor and the collector of the pnp transistor. The p-type semiconductor region 14 serves as the injector (the emitter of the pnp transistor). The n-type semiconductor region 16 serves as the collector of the npn transistor.

Figure 5A:
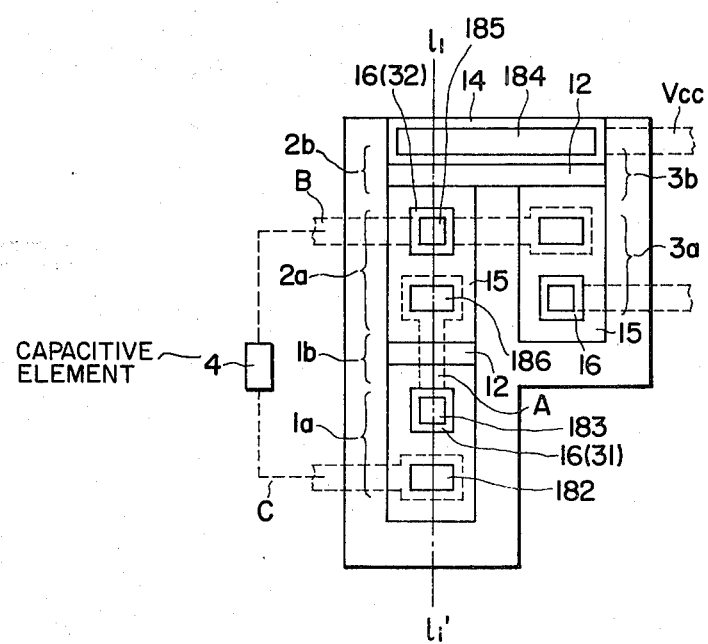
FIG. 5A is another plan pattern view at the time when the oscillation circuit of FIG. 2 is constructed of an integrated circuit.
Figure 5B:
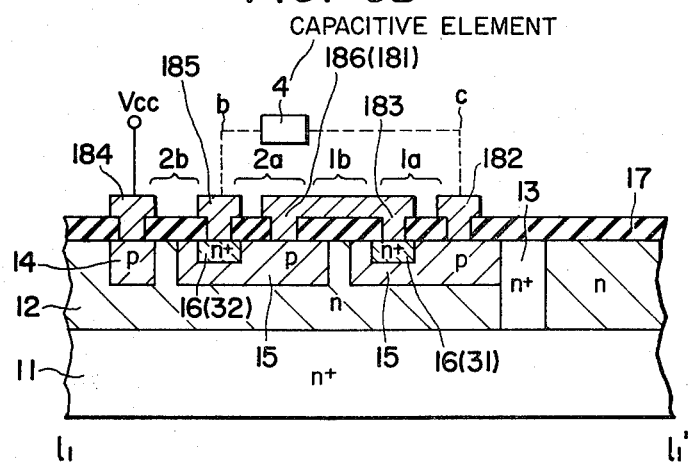
FIG. 5B is a sectional view of the elements of the integrated circuit as taken along line $l_1-l_1'$ in FIG. 5A.

FIGS. 5A and 5B show an embodiment in the case where the injector (or emitter) of the pnp transistor 1b of the I²L circuit in the circuit of FIG. 2 is not separately formed, but where it is formed by utilizing the base of the npn transistor 2a.

FIG. 5A is a plan pattern view, while FIG. 5B is a structural sectional view taken along line $l_1-l_1'$ in FIG. 5A. As illustrated in FIGS. 5A and 5B, the npn transistor 1b of the I²L circuit in FIG. 2 can be integrally formed by making the base of the npn transistor 2a its emitter and making the base of the npn transistor 1a its collector. The embodiment of FIGS. 5A and 5B can therefore diminish the area of the oscillation circuit still more. Symbols in FIGS. 5A and 5B are quite the same as in FIG. 2 and FIGS. 4A and 4B.

Figure 6:
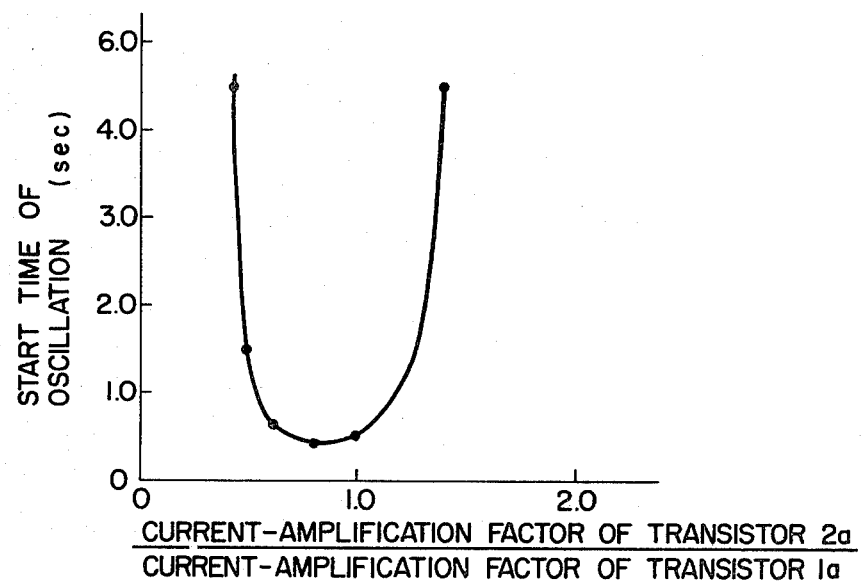
FIG. 6 is a graph showing the relationship between the current amplification factors of transistors 1a and 2a in the oscillation circuit of FIG. 2 and the start time of oscillation.

FIG. 6 shows an example of the characteristic of the start time of oscillation versus the ratio of the current gains of the transistors 1a and 2a in the case where a crystal resonator is employed as the capacitive element in the oscillation circuit of FIG. 2. It is understood that the start time of oscillation becomes remarkably short for the ratio of the current gains between 0.6 and 1.0. The reason therefor is that the collector current of the transistor 3b and the collector current of the transistor 2a become substantially equal in the above range of the current gain ratios. That is, the alteration of the potential at the point C becomes the greatest relative to the alteration of the current (or alteration of the potential) at the point B at this time. When the current gain ratio deviates from these values, the current alteration (or potential alteration) at the point B necessary for causing the potential alteration at the point C is great. (An offset in the case where the point B is the input and the point C is the output becomes great.)

As is well known, the mechanism of oscillation is such that a noise having developed on the input side upon closure of the power supply is amplified and fed back to the input, that the noise is further amplified, that the noise grows in this manner, and that the steady state is reached.

Accordingly, when the offset is great, the gain of the circuit immediately after the closure of the power supply is low, and it takes a long time for the oscillation to reach the steady state. By making the collector currents of the transistors 3b and 2a substantially equal, it is possible to make the offset small and to quicken the start time of oscillation. More particularly, the collector currents of the transistors 3b and 2a may be made equal under the state under which the capacitive element is disconnected.

The optimum current amplification factor rate or current gain ratio is dependent upon the size and shape of the mask pattern of the integrated circuit. It can be designed by selecting the shape and size of the pattern.

Figure 7:
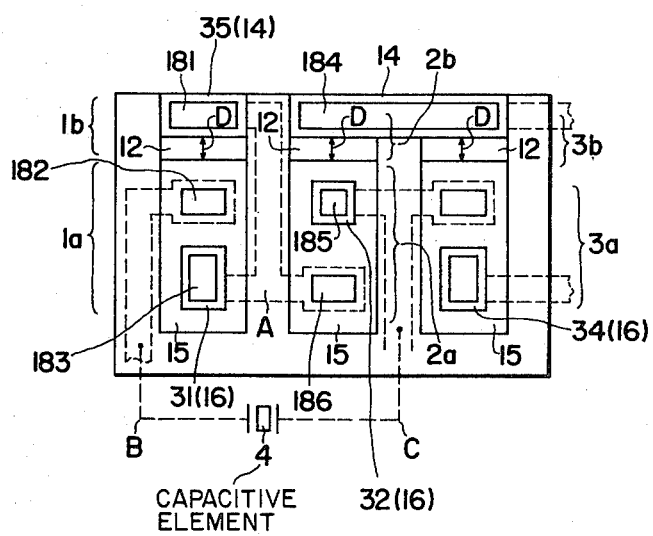
FIG. 7 is a plan pattern view at the time when the oscillation circuit of FIG. 2 is constructed of an integrated circuit, in which the collector areas of the transistors 1a and 2a are especially made different.

The current gain ratio can be easily realized in such a way that, in the pattern of FIG. 4A, a difference is bestowed on the areas of the collector 31 of the transistor 1a and the collector 32 of the transistor 2a as illustrated in FIG. 7.

In the illustrated example, the area of each of the bases 15 of the transistors 1a, 2a and 3a was made 2,112 $\mu m^2$, the area of each of the collectors 31 and 34 of the respective transistors 1a and 3a was made 784 $\mu m^2$, the area of the collector 32 of the transistor 2a was made 630 $\mu m^2$, the base width D of each of the transistors 1b, 2b and 3b was made 7.5 $\mu m$, and the area of the emitter 35 of the transistor 1b was made 308 $\mu m^2$. At this time, the collector area of the transistor 2a was made 0.8 times the collector area of the transistor 1a. As a result, the current amplification factor of the transistor 2a became 0.8 times that of the transistor 1a, and an oscillation circuit of the shortest start time of oscillation could be realized.

Figure 8:
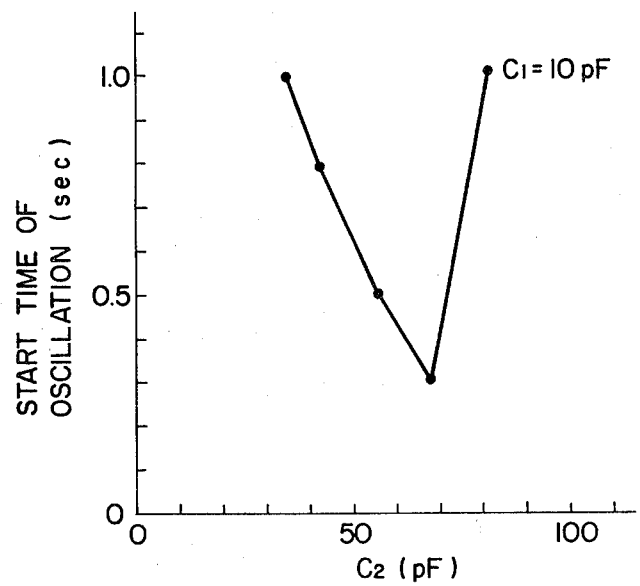
FIG. 8 is a graph showing the characteristic of the start time of oscillation at the time when capacitances are added to points B and C in the oscillation circuit of FIG. 2.

In order to suppress components of unnecessary frequencies and to prevent the entrance of parasitic oscillations, i.e., to shorten the oscillation starting time, and besides, to finely adjust the oscillation frequency, the point B and/or the point C in FIG. 2 may be provided with a capacitance $C_1$ (point B) and/or a capacitance $C_2$. Which of the capacitances $C_1$ and $C_2$ is to be disposed, and the magnitudes of the capacitances differ depending on the sizes, balance and operating current values of the I²L circuits constituting the oscillation circuit and on the necessary duty of the oscillation waveform. By way of example, FIG. 8 shows the characteristic of the oscillation starting time in the case where the magnitude of the capacitance $C_2$ was varied with the capacitance $C_1$ held at 10 pF. As apparent from FIG. 8, the oscillation starting time can be made very short by selecting the capacitance values.

EMBODIMENT 2

Figure 9:
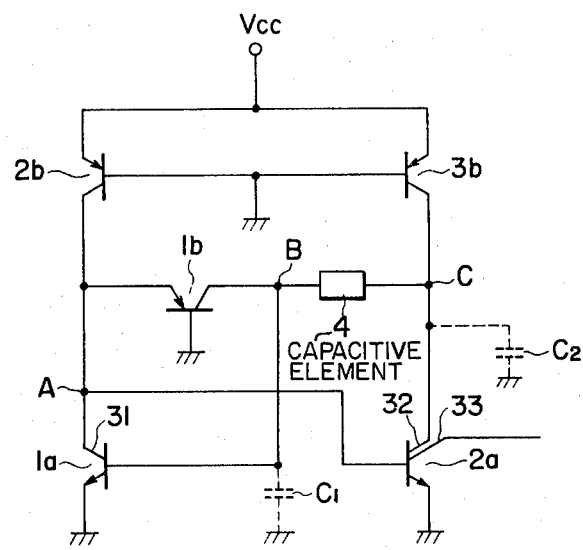
Figure 10:
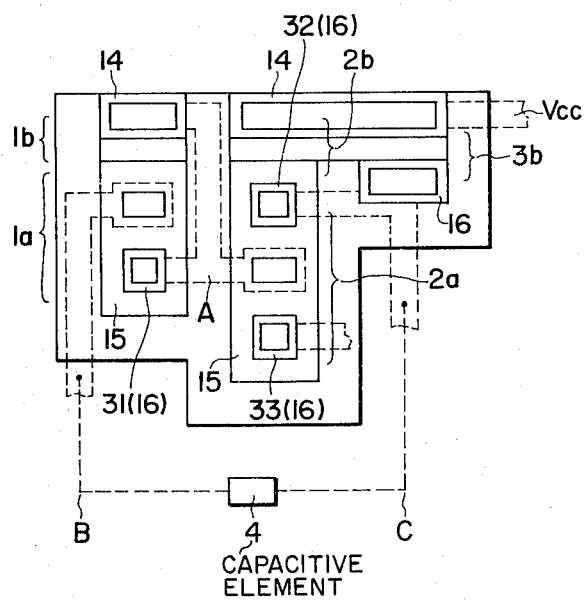
FIG. 10 is a plan pattern view at the time when the oscillation circuit of FIG. 9 is constructed of an integrated circuit.

FIG. 9 shows an embodiment in which the oscillation output is derived from one portion of a multi-collector. FIG. 10 is a plan pattern view of the embodiment in FIG. 9. In the embodiment of FIG. 9, instead of providing the npn transistor 3a of the integrated injection logic circuit in FIG. 2, the npn transistor 2a is made the multi-collector (collectors 32 and 33) output type, and one (33) of the collectors is used as an output terminal.

Also in the oscillation circuit of this embodiment, the oscillation starting time can be shortened by designing the optimum ratio between the area of the collector 31 of the transistor 1a and that of the collector 32 of the transistor 2a as in the foregoing embodiment.

Likewise to the previous embodiment, the point B and/or the point C can be provided with a capacitor.

EMBODIMENT 3

Figure 11:
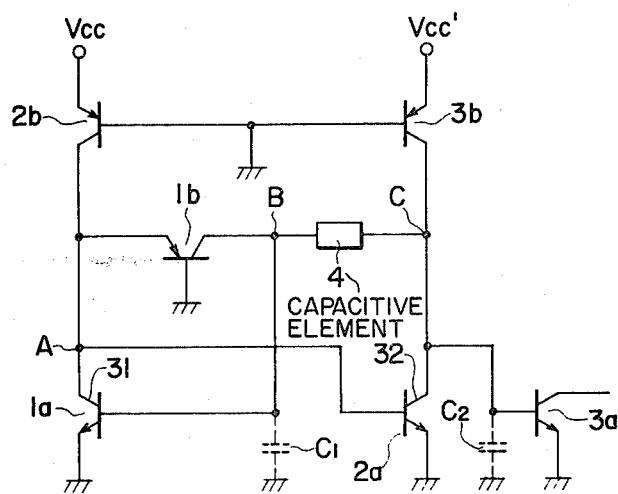
FIG. 11 is a circuit diagram showing a third embodiment in which the oscillation circuit of FIG. 2 is supplied with separate source voltages.

FIG. 11 shows an embodiment in the case where the power supply for the oscillation circuit in FIG. 2 is divided into two.

As illustrated in FIG. 11, the pnp transistors 2b and 3b of the I²L circuits have individual injector terminals, which are supplied with separate supply voltages $V_{CC}$ and $V_{CC}'$. Thus, currents to be fed to points A and C in FIG. 11 can be separately controlled. This has the same effect as selecting the optimum current gain ratio in the embodiment described with reference to FIGS. 6 and 7. The current which is supplied from the transistor 3b to the point C and the collector current which the transistor 2a can absorb are made substantiallly equal so as to reduce the offset, whereby the start time of oscillation can be shortened. It is also possible to vary the duty of the oscillation waveform shown in FIG. 3C.

The voltages $V_{CC}$ and $V_{CC}'$ may be supplied from an identical power supply $V_C$ by connecting a resistor or the like to at least either of the transistors 2b and 3b.

It goes without saying that, besides making different the currents to be fed to the points A and C as in the present embodiment, the current amplification factors can be made different as in the previous embodiments.

As in the previous embodiments, at least either of the points B and C can be provided with a capacitor.

EMBODIMENT 4

Figure 12:
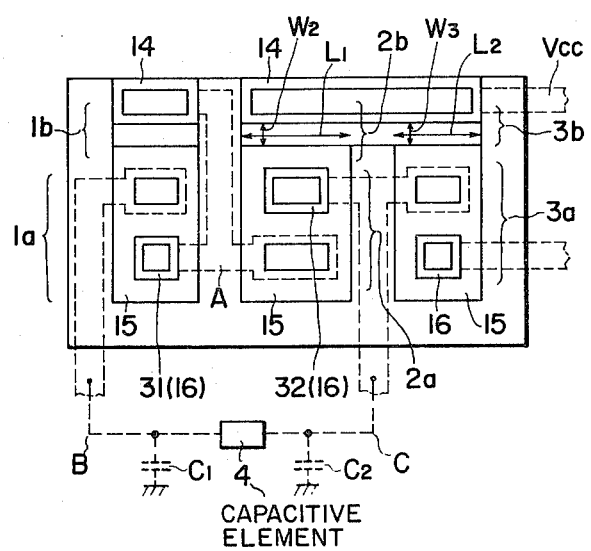
FIG. 12 is a plan pattern view showing a fourth embodiment in which, when the oscillation circuit of FIG. 2 is constructed of an integrated circuit, the opposing lengths between the injectors and collectors of pnp transistors in integrated injection logic circuits are made different.

FIG. 12 shows an embodiment in the case where, likewise to the embodiment shown in FIG. 11, the oscillation starting time can be set to the optimum by the mask pattern of an integrated circuit.

In the present embodiment, the facing lengths $L_1$ and $L_2$ between the injectors and collectors of the pnp transistors 2b and 3b of the I²L circuits in the oscillation circuit of FIG. 2 are made different. In a common base type lateral pnp transistor, the current to flow through the collector can be varied by changing the opposing length between the injector and the collector and in proportion to the opposing length. Accordingly, when the plan pattern as shown in FIG. 12 is used, the collector currents of the pnp transistors 2b and 3b can be varied in proportion to the ratio between the facing lengths $L_1$ and $L_2$ by determining the lengths $L_1$ and $L_2$ as desired, whereby the oscillation starting time can be shortened advantageously.

As a method for changing the current ratio between the pnp transistors 2b and 3b, there is also an expedient in which the base widths $W_2$ and $W_3$ of the pnp transistors 2b and 3b are made different.

Also in the oscillation circuit of this embodiment, the start time of oscillation can be shortened by designing the ratio between the areas of the collector 31 of the transistor 1a and the collector 32 of the transistor 2a to the optimum as in the foregoing embodiments.

As in the previous embodiments, at least either of the points B and C can be provided with a capacitor.

EMBODIMENT 5

Figure 13:
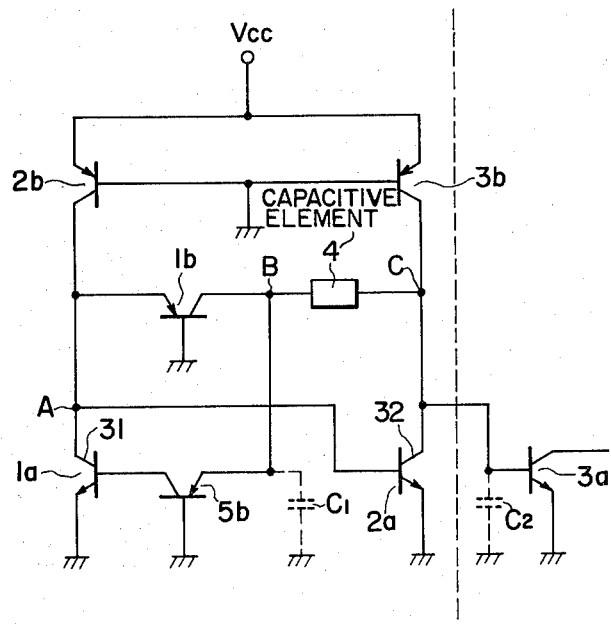
FIG. 13 is a circuit diagram showing a fifth embodiment of the oscillation circuit according to this invention.
Figure 14A:
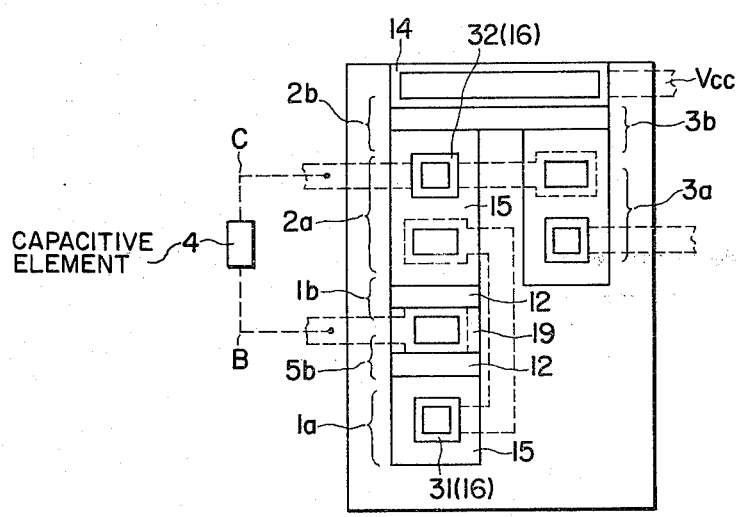
FIG. 14A is a plan pattern view at the time when the circuit of FIG. 13 is constructed of an integrated circuit.
Figure 14B:
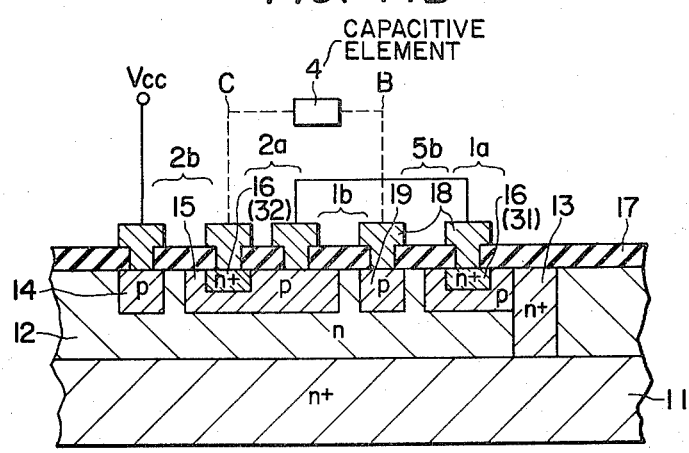
FIG. 14B is a sectional view of the elements of the integrated circuit as taken along line 1-1' in FIG. 14A.

FIG. 13 shows an embodiment wherein a common base type pnp transistor 5b is interposed between the point B in the oscillation circuit of FIG. 2 and the base of the npn transistor 1a of the I²L circuit. FIGS. 14A and 14B are a plan pattern view and a structural sectional view for realizing the oscillation circuit of FIG. 13, respectively.

As seen from the plan pattern view of FIG. 14A and the structural sectional view of FIG. 14B, the pnp transistors 1b and 5b in FIG. 13 can be integrally formed by exploiting the bases of the npn transistors 1a and 2a. As apparent from FIGS. 14A and 14B, the pnp transistor 1b can use the base 15 of the npn transistor 2a as its emitter, and a p-type layer 19 intervening between the npn transistors 2a and 1a as its collector. The pnp transistor 5b uses the p-type layer 19 as its emitter and the base 15 of the npn transistor 1a as its collector, so that the pnp transistor and the npn transistor can be integrally formed. Needless to say, it can be readily performed also in the circuit of FIG. 13 to derive the output of the oscillation waveform by putting the npn transistor 2a into the multi-collector type, to separately feed the supply voltages and to make different the opposing lengths of the pnp transistors 2b and 3b in the plan pattern as respectively illustrated in FIG. 9, FIG. 11 and FIG. 12. The purposes of these measures have been stated in the places descriptive of the respective figures.

Also in the oscillation circuit of this embodiment, the oscillation starting time can be shortened by designing the ratio between the areas of the collector 31 of the transistor 1a and the collector 32 of the transistor 2a to the optimum as in the foregoing embodiments.

As in the previous embodiments, at least either of the points B and C can be provided with a capacitor.

EMBODIMENT 6

Figure 15:
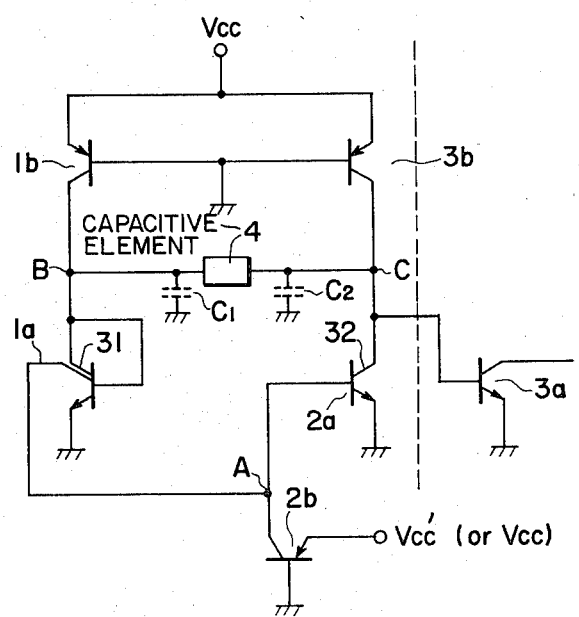
FIG. 15 is a circuit diagram showing a sixth embodiment of the oscillation circuit according to this invention.

FIG. 15 shows an embodiment of the oscillation circuit according to this invention. A circuit arrangement in FIG. 15 will be described below.

In FIG. 15, sets of transistors 1a and 1b, 2a and 2b, and 3a and 3b constitute three integrated injection logic circuits each consisting of the inverse npn transistor and the common base type lateral pnp transistor. Numeral 4 designates a capacitive element.

In the multi-collector of the npn transistor 1a of the I²L circuit, the first collector is connected to the base of the transistor 1a, and the second collector is connected to the base of the npn transistor 2a. The collector of the npn transistor 2a is connected to the base of the npn transistor 3a, and the capacitive element 4 is connected between the base of the npn transistor 1a and the collector of the npn transistor 2a. The injectors of the pnp transistors 1b and 3b of the I²L circuits are connected to a first power supply $V_{CC}$, and the injector of the pnp transistor 2b is connected to a second power supply $V_{CC}'$.

Now, the operation of the oscillation circuit according to this invention shown in FIG. 15 will be explained. The operation of the circuit of FIG. 15 is basically the same as that of the oscillation circuit of FIG. 2, and the oscillation waveforms thereof are similar to those in FIGS. 3A, 3B and 3C. The oscillation waveforms of points A, B and C in FIG. 15 correspond respectively to the oscillation waveforms shown in FIGS. 3A, 3B and 3C, and hence, the operation will be set forth with reference to these figures.

First, consider the time when the npn transistor 1a is in the "off" state, whereas the npn transistor 2a is in the "on" state. (the period of time $T_1$) At this time, the points B and C are at the low potential (substantially 0 V), and a charging current flows from the pnp transistor 1b to the capacitive element 4 to gradually raise the potential of the point B. The rise of the potential of the point B is linear versus time for the same reason as stated with reference to FIGS. 3A-3C. When the potential of the point B has become sufficiently high, the npn transistor 1a turns "on", and the second collector of the npn transistor 1a absorbs all the current from the pnp transistor 2b and thus turns the npn transistor 2a "off."

When the npn transistor 2a has become the "off" state, a current from the pnp transistor 3b becomes a charging current of the capacitive element 4, and the potential of the point C rises gradually. (waveform in the period of time T₂) The rise of the potential of the point C is linear versus time for the same reason as stated in the previous description. When the potential of the point C has risen sufficiently, the base current of the npn transistor 3a increases, and the charging current to the capacitive element 4 decreases.

The currents which the first collector and base of the npn transistor 1a are absorbing when the potential of the point C is rising and the charging current is flowing to the capacitive element 4 are the current from the pnp transistor 1b and the charging current flowing through the capacitive element 4. At this time, the current which the second collector of the npn transistor 1a can absorb is proportional to the currents flowing to the base and first collector of the npn transistor 1a. Therefore, when the potential of the point C has risen sufficiently and the charging current from the capacitive element 4 has decreased, the absorption current of the second collector of the npn transistor 1a decreases, the current from the pnp transistor 2b cannot be absorbed and the npn transistor 2a becomes the "on" state. When the npn transistor 2a has become the "on" state, it abruptly lowers the potential of the point C, with the result that the potential of the point C becomes substantially 0 V. (waveform in the period of time T₃) At this time, the potential of the point B lowers abruptly following the potential of the point C and bcomes 0 V.

By repeating the above operation, the oscillation circuit of FIG. 15 according to this invention operates.

Also the oscillation circuit according to this invention shown in FIG. 15 is composed of the three I²L circuits (1a, 1b), (2a, 2b) and (3a, 3b) as in the oscillation circuit illustrated in FIG. 2, and may be in a very small area. Needless to say, the supply voltage may be approximately 0.6 V as in the oscillation circuit of FIG. 2.

Figures 16A, 16B:
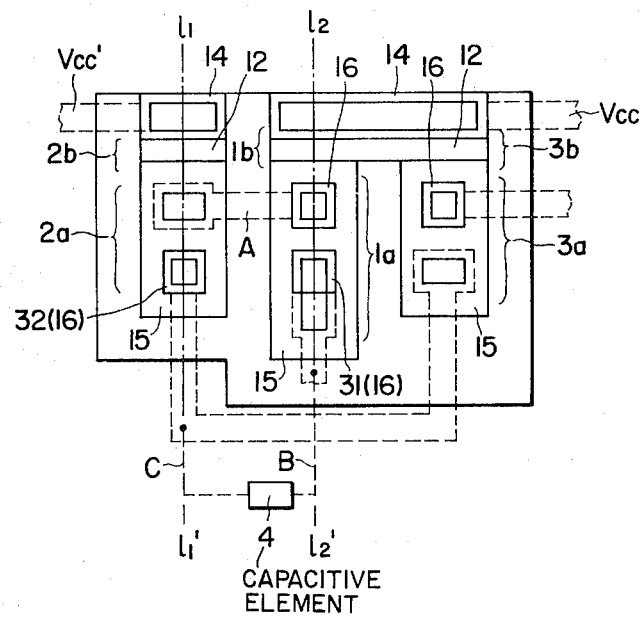
FIG. 16A is a plan pattern view at the time when the circuit of FIG. 15 is constructed of an integrated circuit.
FIG. 16B is a sectional view of the elements of the integrated circuit as taken along line 1-1' in FIG. 16A.

FIGS. 16A and 16B are a plan pattern view and a sectional view for realizing the oscillation circuit shown in FIG. 15, respectively.

Referring to FIG. 16A, the first collector of the npn transistor 1a of the I²L circuit can be connected with a base terminal by providing a common metal contact window for leading out a collector terminal and the base terminal as shown in the figure.

Figure 17A:
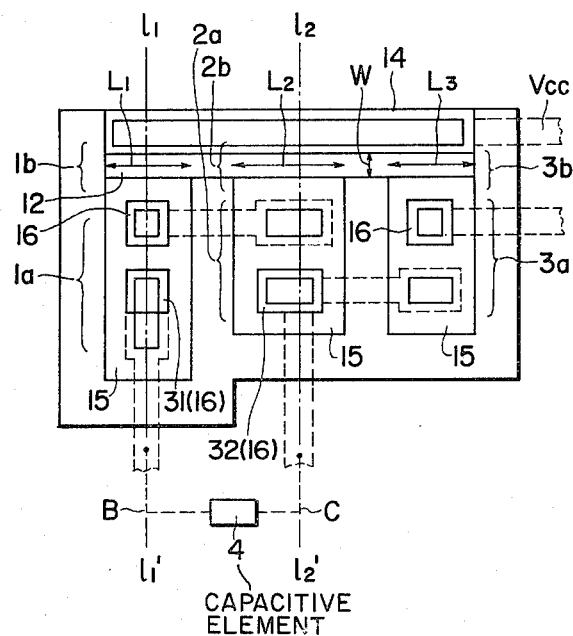
FIG. 17A is a plan pattern view of an integrated circuit of the construction in which the circuit of FIG. 15 is supplied with power from one place.
Figure 17B:
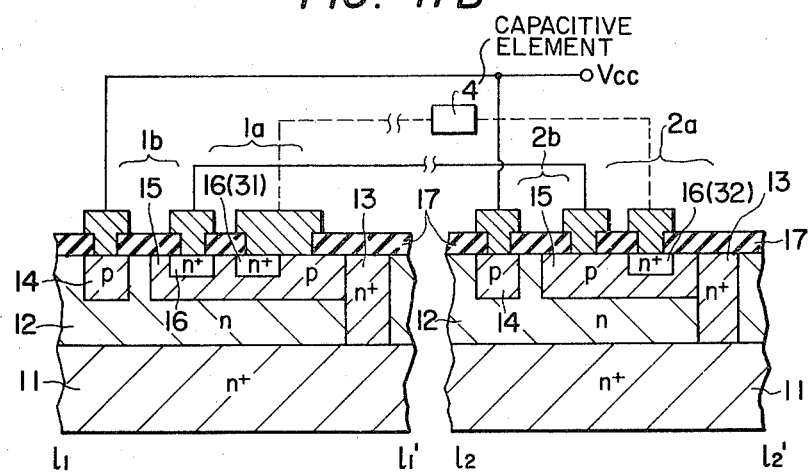
FIG. 17B is a sectional view of the elements of the integrated circuit as taken along line $l_1-l_1'$ and line $l_2-l_2'$ in FIG. 17A.

FIGS. 17A and 17B show another example of a plan pattern view and a sectional view for realizing the oscillation circuit of FIG. 15, respectively.

Although, in the circuit diagram of FIG. 15, and the plan pattern view of FIG. 16, the means for power supply to the pnp transistors 2b and 1b, 3b of the I²L circuits are separately depicted as $V_{CC}$ and $V_{CC}'$, it is also possible to use a single power supply. In case where the single power supply is employed and where it is desired to make different the currents which flow to the pnp transistors 2b and 1b, 3b, the opposing lengths $L_1$ and $L_2$, $L_3$ (or opposing widths W) between the injectors and collectors of the pnp transistors 2b and 1b, 3b may be designed to be different as in FIGS. 17A and 17B.

It can be readily performed also in the oscillation circuit of FIG. 15 to derive the output of the oscillation waveform by putting the npn transistor 2a into the multi-collector type, to separately feed the supply voltages to the pnp transistors 1b and 3b and to make different the facing lengths $L_1$ and $L_3$ of the pnp transistors 1b and 3b in a plan pattern as respectively illustrated in FIG. 9, FIG. 11 and FIG. 12. The purposes of these measures are as have been stated in the places descriptive of the respective figures.

Also in the oscillation circuit of this embodiment, the start time of oscillation can be shortened by designing the ratio between the areas of the collector 31 of the transistor 1a and the collector 32 of the transistor 2a to the optimum as in the foregoing embodiments.

As in the previous embodiments, at least either of the points B and C can be provided with a capacitor.

EMBODIMENT 7

Figure 18:
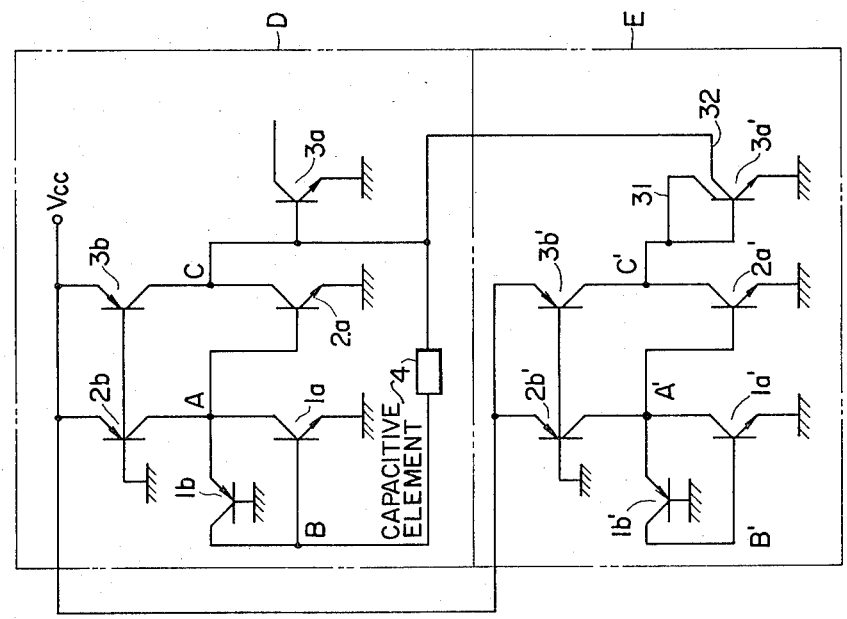

FIG. 18 shows a seventh embodiment of this invention. The essentials of this embodiment are that circuits each being identical in the element dimensions, the fabricating process and the circuit arrangement to the circuit shown in FIG. 2 are formed in proximity and that a crystal resonator 4 is connected between the points B and C of one circuit D, while the other circuit E is used for mere biasing.

A transistor 3a' on the output side of the circuit E for biasing is provided with two collectors and has its one collector 31 connected to its base so as to form the current Miller circuit. The other collector 32 is connected to the point C of the oscillation circuit D.

In the above circuit arrangement, consider the circuit D and the circuit E separately. Letting $I_{C3}$ and $I_{C2}$ denote the respective collector currents of transistors 3b and 2a in the circuit D, the unbalance between these currents at the point C becomes:

$$\Delta I = I_{C3} - I_{C2}$$

This unbalance current $\Delta I$ is an offset current on the output side. Likewise, an offset current of $\Delta I$ develops at the point C of the circuit E because the circuit is arranged under the same condition as that of the circuit D. The transistor 3a' receives the component of the offset current $\Delta I$ as an input current owing to the current Miller circuit. Therefore, letting $\beta$ denote the current gain of the transistor 3a' the base current $I_B$ and the current $I_{C31}$ of the collector 31 become:

$$I_B = \Delta I/(1+\beta)$$

$$I_{C31} = \beta/(1+\beta)\Delta I$$

When the collector 31 and the collector 32 are formed in the same geometry, the current $I_{C32}$ of the collector 32 becomes equal to the currennt $I_{C31}$ of the collector 31. In case where the circuits D and E are connected as in FIG. 18, the unbalance between the currents at the point C becomes:

$$\Delta I' = \Delta I - I_{C32} = \Delta I/(1+\beta)$$

This is $1/(1+\beta)$ of the unbalance caused solely by the circuit D and can be made very small. Thus, it becomes possible to shorten the oscillation starting time.

Figure 19:
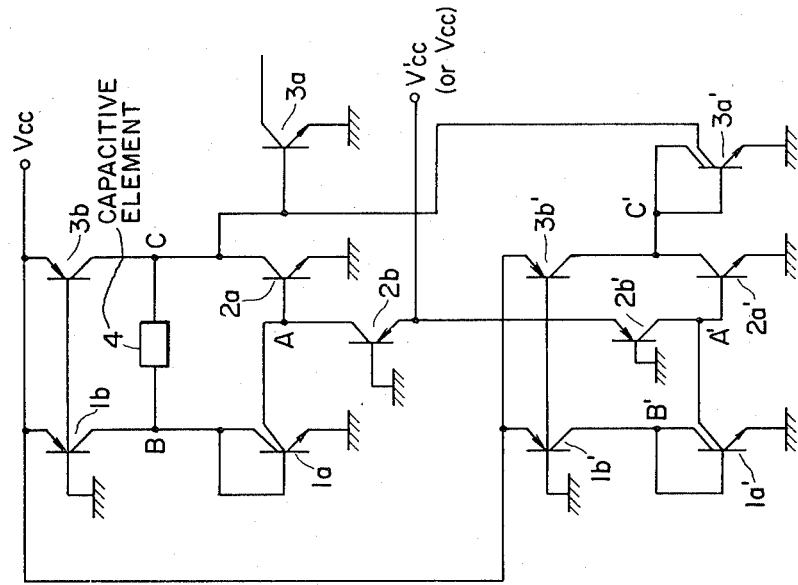
FIGS. 18 and 19 are circuit diagrams showing a seventh embodiment of the oscillation circuit according to this invention.

FIG. 19 shows an embodiment in the case where the above expedient is applied to the oscillation circuit of FIG. 15. Also in this case, the offset current can be made $1/(1+\beta)$ as in FIG. 18, and the oscillation starting time can be shortened.

The oscillation circuit of this embodiment has the following features:
(1) The circuit D and the circuit E can be fabricated in proximity within an integrated circuit as shown in FIG. 18, and these circuits D and E can be formed into substantially the same characteristics.
(2) By forming the circuits D and E within an integrated circuit, the temperature characteristics can be designed into substantially the same ones.
(3) The offset current can be reduced to $1/(1+\beta)$, and this is effective especially in such a case where the current gain is low.

Now, some advantages of the oscillation circuit according to this invention will be added.

In the case of employing a crystal resonator as the capacitive element of the oscillation circuit according to this invention, even when a supply current (or a supply voltage corresponding to the current) has fluctuated several orders, the oscillation frequency is a frequency peculiar to the crystal resonator itself and a stable oscillating operation is attained. One factor for the fact that the stable oscillation is acquired over such a wide range of supply currents, is that a voltage applied across the crystal resonator in the oscillation circuit according to this invention is limited by the junction voltage of a diode, so it does not undergo any great fluctuation. In addition, the oscillation circuit according to this invention can oscillate at a supply current less than several $\mu$A. Owing to these features, the oscillation circuit with the crystal resonator according to this invention is advantageous especially when employed in a system of great power-supply fluctuations. Since the operation is possible even at the low current dissipation, the optimum performance is demonstrated as an oscillation circuit for a system employing a battery, particularly for a wrist watch etc., owing also to the small area of the oscillation circuit according to this invention.

While the advantages in the case of employing the crystal resonator as the capacitive element of the oscillation circuit according to this invention have been described above, advantages in the case of using a capacitor as the capacitive element will be stated below.

In the case of employing the capacitor as the capacitive element, the oscillation circuit according to this invention has its oscillation frequency varied in proportion to the current of power supply. Moreover, the oscillation frequency can be arbitrarily set by varying the capacitance of the capacitor. The oscillation circuit therefore has the advantage that, by converting an input voltage into a current (or by directly using an input current), the voltage or current value can be converted into the oscillation frequency. These features are applicable to a system called "phase locked loop," a system for analog/digital conversion, etc., and bring forth merits which are especially effective in industries.

As thus far described, according to this invention, an oscillation circuit suitable for an integrated circuit is obtained in a simple construction having a small number of components. Especially in case where the oscillation circuit according to this invention is built in the integrated circuit, the area which the present circuit occupies can be drastically diminished as compared with the occupying area of the prior-art oscillation circuit. In building the present circuit in the integrated circuit, it can be readily formed in coexistence with other integrated circuits without altering conventional IC techniques.

The oscillation circuit according to this invention can be operated by a supply voltage equal to the junction voltage of a diode, and a power dissipation required for the operation may be conspicuously low. This brings forth very advantageous results especially when utilized for a system as operated by a battery. In the foregoing embodiments, a crystal resonator has been employed as a capacitive element in the oscillation circuit. In this case, the oscillation circuit has the advantage that it operates stably for a wide range of supply voltages (or currents). A capacitor can also be used as the capacitive element. In this case, the oscillation circuit can be employed as a voltage-to-frequency converter or a current-to-frequency converter, and it becomes applicable to a phase locked loop circuit or an analog/digital converter. In this manner, the oscillation circuit according to this invention has various advantages in industries.

What is claimed is:

1. A circuit comprising an amplifier having a first transistor which has a first load transistor connected to a collector thereof, a second transistor which has a second load transistor connected to a collector thereof, means for transmitting a collector output of said first transistor to a base of said first transistor, means for transmitting a collector output of said first transistor to a base of said second transistor, an input terminal connected to a base of said first transistor, and a first output terminal connected to a collector of said second transistor, further comprising a capacitive element which is connected between said input terminal and said first output terminal, so that a collector output of said second transistor is fed back to a base of said first transistor so that said circuit operates as an oscillator, wherein means for making a collector current of said second transistor and a collector current of said second load transistor substantially equal, thereby to shorten the oscillator start-up time.

2. A circuit comprising an amplifier having a first transistor which has a first load transistor connected to a collector thereof, a second transistor which has a second load transistor connected to a collector thereof, means for transmitting a collector output of said first transistor to a base of said first transistor, means for transmitting a collector output of said first transistor to a base of said second transistor, an input terminal connected to a base of said first transistor, and a first output terminal connected to a collector of said second transistor, further comprising a capacitive element which is connected between said input terminal and said first output terminal, so that a collector output of said second transistor is fed back to a base of said first transistor so that said circuit operates as an oscillator, wherein means is provided for controlling a collector current of said second load transistor, and said collector current of said second load transistor and a collector current of said second transistor are made substantially equal to shorten the oscillator start-up time.

3. A circuit according to claim 1 or 2, wherein said collector output of said first transistor is transmitted to said base thereof through a third load transistor.

4. A circuit according to claim 3, wherein said third load transistor and said first transistor are respectively a pnp transistor and an npn transistor of a first integrated injection logic circuit, said first load transistor and said second transistor are respectively a pnp transistor and an npn transistor of a second integrated injection logic circuit, and said second load transistor is a pnp transistor of a third integrated injection logic circuit.

5. A circuit according to claim 1 or 2, wherein means is provided for transmitting an output of said first output terminal to a base of a third transistor, and an output is derived from a second output terminal connected to a collector of said third transistor.

6. A circuit according to claim 1 or 2, wherein said second transistor has a first collector and a second collector, said second load transistor is connected to said first collector, and said first output terminal is connected to said second collector.

7. A circuit according to claim 1, wherein a current gain of said second transistor is different from that of said first transistor.

8. A circuit according to claim 7, wherein areas of the bases of said first and second transistors are substantially equal, and an area of the collector of said second transistor is different from that of said first transistor.

9. A circuit according to claim 1, wherein a collector current of said first load transistor is different from that of said second load transistor.

10. A circuit according to claim 9, wherein a facing length between the emitter and the collector of said first load transistor is different from that of said second load transistor.

11. A circuit according to claim 9, wherein a base width between the emitter and the collector of said first load transistor is different from that of said second load transistor.

12. A circuit according to claim 9, wherein a current injected from the emitter to the base of said first load transistor is different from that of said second load transistor.

13. An oscillation circuit comprising two circuits which are connected in parallel, each of which includes a first transistor having a first load transistor connected to a collector thereof, a second transistor having a second load transistor connected to a collector thereof, means for transmitting a collector output of said first transistor to a base of said first transistor, means for transmitting a collector output of said first transistor to a base of said second transistor, and a capacitive element connected between said collector of said second transistor and said base of said first transistor of one of said parallel circuits for feeding back an output of said second transistor to said first transistor, wherein said one of said parallel circuits is employed as an active circuit and the other as a biasing circuit, the collector output of said second transistor of said biasing circuit being transmitted to the collector of said second transistor of said active circuit and further wherein current gains of said first transistor and said second transistor are made different, thereby to make a collector current of said second transistor and a collector current of said second load transistor substantially equal, thereby to shorten the oscillator start-up time.

14. An oscillation circuit comprising two circuits which are connected in parallel, each of which includes a first transistor having a first load transistor connected to a collector thereof, a second transistor having a second load transistor connected to a collector thereof, means for transmitting a collector output of said first transistor to a base of said first transistor, means for transmitting a collector output of said first transistor to a base of said second transistor, and a capacitive element connected between said collector of said second transistor and said base of said first transistor of one of said parallel circuits for feeding back an output of said second transistor to said first transistor, wherein said one of said parallel circuits is employed as an active circuit and the other as a biasing circuit, the collector output of said second transistor of said biasing circuit being transmitted to the collector of said second transistor of said active circuit wherein means is provided for controlling a collector current of said second load transistor, and said collector current of said second load transistor and a collector current of said second transistor are made substantially equal to shorten the oscillator start-up time.

* * * * *